United States Patent [19]

McCall, Jr. et al.

[11] Patent Number: 4,740,987
[45] Date of Patent: Apr. 26, 1988

[54] DISTRIBUTED-FEEDBACK LASER HAVING ENHANCED MODE SELECTIVITY

[75] Inventors: Samuel L. McCall, Jr., Gillette; Philip M. Platzman, Short Hills, both of N.J.

[73] Assignee: American Telephone and Telegraph Company, AT&T Bell Laboratories, Murray Hill, N.J.

[21] Appl. No.: 879,934

[22] Filed: Jun. 30, 1986

[51] Int. Cl.$^4$ ............................ H01S 3/08; H01S 3/19
[52] U.S. Cl. ............................... 372/96; 372/45; 372/46
[58] Field of Search ................. 372/96, 44, 45, 46

[56] References Cited

U.S. PATENT DOCUMENTS 3,760,292  9/1973  Kogelnik et al. ............... 331/94.5 C
4,096,446  6/1978  Haus et al. ..................... 331/94.5 C
4,701,930  10/1987  Akiba et al. ..................... 372/96

FOREIGN PATENT DOCUMENTS 2151402  7/1985  United Kingdom ................. 372/96

OTHER PUBLICATIONS

"Stimulated Emission in a Periodic Structure", *Applied Physics Letters*, vol. 18 (1971), pp. 152–154.
"Antisymmetric Taper of Distributed Feedback Lasers", *IEEE Journal of Quantum Electronics*, vol. QE-12 (1976), pp. 532–539.
"1.5 $\mu$m Phase-shifted DFB Lasers for Single-mode Operation", *Electronics Letters*, vol. 20 (1984), pp. 80–81, by K. Sekartedjo et al.
H. C. Casey, Jr. et al., "Heterostructure Lasers", Part A, Academic Press, 1978, pp. 24–30.
G. P. Agrawal et al., Longwavelength Semiconductor Lasers, Van Nostrand Reinhold Company, New York, 1986, p. 40.

Primary Examiner—James W. Davie
Assistant Examiner—Georgia Y. Epps
Attorney, Agent, or Firm—Peter A. Businger

[57] ABSTRACT

A distributed-feedback laser includes in its grating a localized phase-slip discontinuity which is placed off-center. Such discontinuity results in a quarter-wave phase slip, and it can be placed, e.g., such as to maximize the difference between threshold gain of the lowest-lasing mode and cavity loss of the next-to-lowest-lasing mode. The invention is applicable especially where laser output intensity differs at two output facets and results in enhanced mode selectivity during laser operation.

14 Claims, 1 Drawing Sheet

DISTRIBUTED-FEEDBACK LASER HAVING ENHANCED MODE SELECTIVITY

TECHNICAL FIELD

The invention is concerned with distributed-feedback lasers.

BACKGROUND OF THE INVENTION

While, conventionally, feedback in lasers can be produced by a Fabry-Perot cavity, there has been strong recent interest in lasers in which feedback is produced by distributed scattering by a grating which provides for spatially periodic variation in effective index of refraction. Such so-called distributed feedback lasers (DFB lasers) are described in U.S. Pat. No. 3,760,292, issued Sept. 18, 1973 to H. W. Kogelnik et al., in the paper by H. Kogelnik et al., "Stimulated Emission in a Periodic Structure", *Applied Physics Letters*, Vol. 18 (1971), pp. 152-154, and in numerous further items in the open literature. As compared with conventional lasers, distributed feedback lasers have fewer allowed modes.

One aspect of distributed feedback laser design which receives particular attention in the following is a concern with mode stability or selectivity, i.e., the degree of insensitivity of single-mode laser operation with respect to unavoidable variations in operating conditions such as, e.g., variations in operating temperature or pump current. In this respect it has been found that the introduction of a central coupling-strength discontinuity promotes oscillation of a single mode in preference to the nearest redundant modes. Resulting preferred grating structure is described in U.S. Pat. No. 4,096,446, issued June 20, 1978 to H. A. Haus et al., and in the paper by H. A. Haus et al., "Antisymmetric Taper of Distributed Feedback Lasers", *IEEE Journal of Quantum Electronics*, Vol. QE-12 (1976), pp. 532-539.

Various methods have been proposed for the manufacture of gratings with a central discontinuity, and the effects of such a discontinuity have received a considerable amount of experimental as well as theoretical attention. The following items are cited as representative in these respects:

K. Sekartedjo et al., "1.5-$\mu$m Phase-shifted DFB Lasers for Single-mode Operation", *Electronics Letters*, Vol. 20 (1984), pp. 80-81;

K. Utaka et al., "Analysis of Quarter-wave-shifted DFB Laser", *Electronics Letters*, Vol. 20 (1984), pp. 326-327;

F. Koyama et al., "1.5-$\mu$m Phase-adjusted Active Distributed Reflector Laser for Complete Dynamic Single-mode Operation", *Electronics Letters*, Vol. 20 (1984), pp. 392-393; and K. Utaka et al., "$\lambda$/4-Shifted InGaAsP/InP DFB Lasers by Simultaneous Holographic Exposure of Positive and Negative Photoresists", *Electronics Letters*, Vol. 20 (1984), pp. 1008-1010.

Common to grating structures disclosed in items as cited above is central or near-central placement of a discontinuity in a grating structure, the possibility of off-center placement having been either ignored or else considered as detrimental.

SUMMARY OF THE INVENTION

In the interest of enhanced mode selectivity during device operation, a phase slip discontinuity in the distributed-feedback structure in or alongside an active layer of a laser is placed off-center. Preferred phase-slip discontinuity produces a quarter-wave phase slip, resulting in plus or minus $\pi/2$ change in phase in radiation traveling across the discontinuity as compared with the case where such discontinuity is absent. Phase slip may be due, e.g., to a discontinuity in coupling constant.

DETAILED DESCRIPTION

Figure 1:
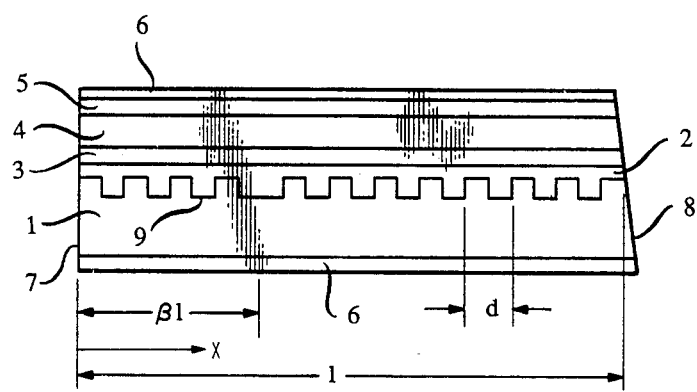
FIG. 1 is a schematic sectional view of a distributed feedback semiconductor laser diode including a grating for providing an off-center phase slip in accordance with the invention.

FIG. 1 shows a layered structure comprising substrate 1, buffer layer 2 which also acts as a cladding layer, active layer 3, cladding layer 4, cap layer 5, and contact layers 6. One facet, 7, of the structure is cleaved to function as a reflecting facet during device operation, the other, 8, is sawcut at a slight angle for preventing Fabry-Perot feedback while serving as primary light output facet. (Alternatively, to serve as an output facet, a cleaved surface may be anti-reflection coated.) Distributed feedback is provided by grating 9 consisting of corrugations at the interface between buffer layer 2 and active layer 3; in accordance with the invention, an off-center phase slip is included in the grating.

Material compositions, dimensions, and manufacturing methods suitable for distributed-feedback semiconductor laser diodes are well known in the art. For example, for a laser diode operating at a wavelength of approximately 1.55 micrometer, the following represents a typical approach: An indium phosphide substrate is provided with surface grating corrugations by etching with a saturated bromine-and-phosphoric-acid solution or a dilute mixture of hydrobromic acid and nitric acid in the presence of a lithographically defined pattern in an overlying resist material. The etched surface is cleaned, and layers are sequentially deposited by liquid phase epitaxial deposition. Typical thicknesses and compositions of deposited layers are as follows: A 0.3-micrometer buffer layer of n-doped indium gallium arsenide phosphide, a 0.2-micrometer active layer of undoped indium gallium arsenide phosphide, a 2-micrometer cladding layer of p-doped indium phosphide, and a 0.3-micrometer cap layer of p-doped indium gallium arsenide phosphide.

If the length of a grating is designated as l, a quarter-wave phase slip is induced at a point at a distance $\beta l$ from an endpoint of the grating, where $\beta$ is between 0 and 1. In accordance with the invention, and for the sake of optimization with respect to mode selectivity especially when a laser is to provide different amounts of light output from its two output facets. preferred values of $\beta$ either are less than or equal to 0.45, preferably less than or equal to 0.4, or else greater than or equal to 0.55, preferably greater than or equal of 0.6. Typically, in the interest of enhanced mode selectivity, placement of the coupling strength discontinuity is closer to the more reflective of the two output facets.

Quarter-wave phase slip may be produced, as shown in FIG. 1, by increasing the distance between constant-width corrugation ridges at the point where phase slip is desired, resulting in a positive quarter-wave phase slip at that point. More specifically, if d denotes the period of a grating consisting of grooves and ridges having width d/2, a positive quarter-wave phase slip is obtained when the distance between two adjacent ridges is d. Conversely, to produce a negative quarter-wave phase slip, the distance between such ridges may be rduced to 0, resulting in a ridge having width d at such point. Alternatively, instead of phase slip being introduced abruptly, i.e., by a single change in spacing or width of corrugation ridges, spacing may change gradually over an interval such that, over the length of the interval, a positive or negative quarter-wave phase slip is achieved. For the sake of specificity, the position of such interval in the grating is determined by the point at which half (an eighth of a wave) of the desired phase slip has been produced. The length of the interval typically does not exceed 20 percent of the length of the grating.

Refractive index at the point or in the interval of phase slip may differ from refractive index along the rest of the grating. Accordingly, phase slip may be produced, with or without spacing changes, by changes in effective refractive index as produced, e.g., by changes in material composition or layer thickness. During laser operation, vacuum wavelength is directly related to the period d of the grating, such wavelength being expressible as 2d times a quantity generally designated as effective refractive index. Effective refractive index depends on material as well as geometrical parameters such that, indeed, geometrical variations can be compensated for by material variations and vice-versa. Effective refractive index can be defined as $n_{eff}(x) = k(x)/k_o$, where $k(x)$ is the propagation constant at a point x (see FIG. 1), and $k_o$ is the freespace propagation constant of radiation of interest. The use of higher-order gratings such as second- and third-order gratings is not precluded.

Optimized off-center placement of quarter-wave phase slip in accordance with the invention can be determined experimentally, including techniques such as computer simulation. In the interest of enhanced mode selectivity, such placement can be chosen such that the difference between threshold gain (which is equal to cavity loss) of the lowest-lasing mode, and cavity loss of the next-to-lowest-lasing mode is maximized.

One experimental method suitable for deciding between different placements of phase slip is as follows: An auxiliary external variablefrequency light source is used to shine light on a specimen laser in the direction opposite to desired light output, and a voltage is applied betwen the laser electrodes. Voltage bretween electrodes is gradually increased while the reflectivities of the lowest and next-to-lowest modes are monitored, next-to-lowest mode being identified by the most narrow reflectivity spike other than that corresponding to the lowest mode. As the reflectivity for the lowest mode becomes very large relative to that of the next-to-lowest mode, the width of the reflectivity peaks of these to modes as a function of frequency is determined. Preferably, in accordance with this procedure of laser evaluation for the purpose of the invention, the magnitude of the difference between these two widths is as large as possible. Since the width of the peak corresponding to the lowest mode goes to zero as its amplitude becomes large, a convenient approximation is obtained simply by seeking for maximization of the next-to-lowest peak width at this point.

An alternate method for optimizing phase slip placement is by computer simulation; in this respect the following paper by the present inventors is cited and incorporated herein by reference: S. L. McCall et al., "An Optimized $\pi/2$ Distributed Feedback Laser", *IEEE Journal of Quantum Electronics,* Vol. QE-21 (1985), pp. 1899–1904.

The invention is applicable to devices for the stimulated emission of optical radiation comprising an active layer, means such as, e.g., electrical or optical pump means for creating a population inversion in the active layer, and distributed feedback means. The latter provide for spatial variations which result in effective refractive index variations, e.g., at a corrugated interface between materials having different refractive indices. An air interface is not precluded. As discussed above in connection with the phase-slip discontinuity, effective refractive index variations in a layer serving as distributed feedback means can also be produced by compositional and/or thickness variations in layer material as produced, e.g., by in-diffusion, ion implantation, molecular beam epitaxial deposition, or metal-organic chemical vapor deposition.

The invention is considered as particularly suitable for application to Group III–V and Group II–VI semiconductor lasers and, more generally, where an active layer is made of a material which produces gain for at least one undesired mode.

EXAMPLE.

A computer simulation was carried out for the case of an indium gallium arsenide phosphide laser diode having one cleaved facet and one saw-cut facet. With reflectivity of the cleaved facet taken as 0.3 (and as zero for the saw-cut facet), placement of the phase slip with $\beta = 0.291$ was found to result in maximization of the difference between threshold gain for the lowest-lasing mode and threshold gain for the next-to-lowest-lasing mode.

Benefits arising from such placement of phase slip can be appreciated, e.g., on the basis of expected yield in device manufacture, where variations in spacing of a cleaved surface relative to the location of the phase slip are unavoidable. It has been determined in this respect that a grating not including any phase slip results in lasers, 50 percent of which exhibit a difference in gain below 0.25 for the lowest and next-to-lowest modes, while the complementary 50 percent have a difference in gain above such value. For a centrally-placed phase slip, the corresponding value is 0.35

Such low values are contrasted with a value of 0.75 for placement corresponding to $\beta = 0.291$ in accordance with this embodiment of the invention.

Finally, for the sake of an extreme comparison, essentially worst-possible placement of a quarter-wave phase slip was found to be at the point corresponding to $\beta$ approximately equal to 0.6, with difference in gain of less than 0.03 expected for half of manufactured lasers.

What is claimed is:
1. Device for stimulated emission of optical radiation, said device comprising an active layer, means for creating a population inversion in said active layer, and distributed feedback means having two endpoints and adapted to be in optical coupling relationship with radiation propagating along said active layer in two mutually opposite directions, said distributed feedback means providing, in said directions, for spatially periodic variations of effective refractive index and a spatially localized phase-slip discontinuity, said device being CHARACTERIZED IN THAT said localized phase-slip discontinuity is spaced from an endpoint of said distributed feedback means by a distance which is not more than 0.45 times the length of said distributed feedback means.

2. Device of claim 1 in which, aside from said discontinuity, said effective refractive index variations are uniformly spatially periodic.

3. Device of claim 1 in which said localized phase-slip discontinuity is such as to result in a quarter-wave phase slip.

4. Device of claim 1 in which said localized phase-slip discontinuity is placed so as to maximize the difference between threshold gain of the lowest-lasing mode and the cavity loss of the next-to-lowest lasing mode.

5. Device of claim 1 in which said localized phase-slip discontinuity extends over a region of said distributed feedback means, said region having a length which does not exceed 20 percent of the length of said distributed feedback means.

6. Device of claim 5 in which effective refractive index in said region differs from effective refractive index in the complementary portion of said distributed feedback means.

7. Device of claim 1 in which said spatial variations result from corrugations at an interface.

8. Device of claim 7 in which said corrugations are produced by etching.

9. Device of claim 1 in which said spatial variations result from material variations.

10. Device of claim 9 in which said material variations comprise compositional variations.

11. Device of claim 9 in which said material variations comprise thickness variations.

12. Device of claim 1, said device having a cleaved facet as a reflecting surface.

13. Device of claim 1, said device having a saw-cut facet as a nonreflecting surface.

14. Device of claim 1 in which reflectivity at said two endpoints differs and in which said phase-slip discontinuity is situated nearer to the endpoint at which reflectivity is higher.

* * * * *